(12) United States Patent
Te Kolste et al.

(10) Patent No.: US 6,864,980 B2
(45) Date of Patent: Mar. 8, 2005

(54) LINEAR FILTER BASED WAVELENGTH LOCKING OPTICAL SUB-ASSEMBLY AND ASSOCIATED METHODS

(75) Inventors: Robert Te Kolste, Charlotte, NC (US); Robert Russell Boye, Charlotte, NC (US); Alvaro A. Cruz-Cabrera, Charlotte, NC (US); Eric Schwartz, Concord, NC (US)

(73) Assignee: Digital Optics Corp., Charlotte, NC (US)

( * ) Notice: Subject to any disclaimer, the term of this patent is extended or adjusted under 35 U.S.C. 154(b) by 249 days.

(21) Appl. No.: 10/060,096

(22) Filed: Jan. 31, 2002

(65) Prior Publication Data
US 2003/0142315 A1 Jul. 31, 2003

Related U.S. Application Data
(60) Provisional application No. 60/349,412, filed on Jan. 22, 2002.

(51) Int. Cl.[7] .......................... G01B 11/00; G01N 21/00

(52) U.S. Cl. .................. 356/394; 356/435; 356/445
(58) Field of Search .......................... 356/394, 309, 356/435, 445, 419, 454, 519; 372/18, 32, 23, 25; 398/33, 95, 196; 385/15, 31

(56) References Cited

U.S. PATENT DOCUMENTS 5,896,201 A * 4/1999 Fukushima .................. 356/394
6,639,679 B2 * 10/2003 Frojdh ......................... 356/454
6,661,818 B1 * 12/2003 Feldman et al. .............. 372/32

* cited by examiner

Primary Examiner—Frank G. Font
Assistant Examiner—Layla Lauchman
(74) Attorney, Agent, or Firm—Susan S. Morse

(57) ABSTRACT

A wavelength detector includes a beam splitter block that taps off two spatially separated beams and a linear filter in an optical path of one of the two beams. The linear filter may be provided on the beam splitter block. The linear filter may be a notch anti-reflective filter in the optical path of the application beam. One or both of the beams may be focused on to their respective detectors.

20 Claims, 4 Drawing Sheets

US 6,864,980 B2

LINEAR FILTER BASED WAVELENGTH LOCKING OPTICAL SUB-ASSEMBLY AND ASSOCIATED METHODS

FIELD OF THE INVENTION

The present invention is directed to a wavelength monitor/locker using a linear filter, more particularly to an integrated wavelength locker which can be placed in an optical path of an application beam or in an optical path of a monitor beam.

BACKGROUND OF THE INVENTION

Some radiation sources exhibit wavelength drift over time in excess of that tolerable for many applications. This drift becomes increasingly important as the lifetimes over which these radiation sources are to be deployed increases. For some applications, e.g., those having multiple channels, wavelength stability is required to be within a few percentage of the channel spacing. Factors such as temperature, age, operating power level, etc., all affect the output wavelength. Parameters such as the direction of the wavelength change, the degree of the change, and the percentage of the light being radiated at the different wavelengths may be monitored. By monitoring any or all these parameters, the radiation source may be controlled in accordance with known techniques to stabilize the output of the radiation source.

Such monitoring and stabilizing systems typically involve using a unit that is external to the radiation source itself. Such external units include crystal gratings, fiber gratings, spectrometers, and Fabry-Perot etalons, both straight and inclined. The grating systems include relatively large control units external to the radiation source. While etalon-based systems offer a more compact solution, so far these etalons are still separate units that may become improperly aligned, either with photodetectors or with optical elements required to direct and control the light onto the photodetectors. Further, etalon performance is very sensitive to angular alignment. Etalon perfomrance, particularly for solid etalons, is also very sensitive to temperature shifts.

One problem encountered in ensuring coverage of a particular wavelength region of interest is that the wavelength dependence of the output of the above configurations needs to be strong. In other words, the slope of a curve of an output versus wavelength must sufficiently steep to resolve a wavelength being detected. This leads to a requirement for multiple filters, increasing the cost and complexity of the system.

Another problem when using an etalon, or any wavelength-dependent component for which optical path length affects the output, is that these configurations typically require a collimated beam. The detectors are typically placed adjacent to these wavelength dependent components. Providing a collimated laser beam onto the detectors is inefficient, given the size limits placed on the detectors. This also leads to an increased number of wavelength dependent components needed to accurately monitor the wavelength.

Further, etalon response is periodic with respect to wavelength, so while an etalon may provide a large range of wavelength coverage, the slope in a given region may not be sufficient or may not be unique, rendering a wavelength unresolvable. This is especially problematic when dealing with fixed wavelength or narrowly tunable radiation sources and a plurality of channels, each occupying a narrow wavelength region, e.g., 50 GHz.

SUMMARY OF THE INVENTION

The present invention is therefore directed to a wavelength monitor/locker which substantially overcomes one or more of the problems due to the limitations and disadvantages of the related art.

It is an object of the present invention to provide a very sensitive wavelength monitor. It is another object of the present invention to provide a compact wavelength monitor.

At least one of the above and other objects may be realized by providing a wavelength detector including a beam splitter block having first and second surfaces, the beam splitter block receiving an input beam, tapping off first and second beams that are spatially separated from one another, the first and second beams being output from the first surface, and outputting a third beam from the second surface to proceed to an application. An optical element on the beam splitter block provides a further optical function to at least one of the first and second beams, each of the first and second surfaces of the beam splitter block providing the tapping and/or the further optical function to the first beam and/or the second beam. A linear filter having a wavelength dependent response is in an optical path of one of the first and second beams. A first detector receives a filter beam having from the linear filter and a second detector receives the reference, i.e., unfiltered, beam.

The optical element on the beam splitter block may be the focusing element or the linear filter. The linear filter may be on the second surface and the third beam passes through the linear filter. The focusing element may focus both the filter beam and the reference beam. The focusing element may focus only the reference beam on the second detector. The linear filter may be a notch filter. The beam splitter block may split off the first beam at the first surface and the second beam at the second surface. The first and second detectors may be in the same plane. The wavelength detector may include a mount supporting the first and second detectors. The first and second beams may be tapped off the input beam at the second surface and separated by a diffractive splitter at the first surface. The focusing element may be in an optical path of the filter beam. The reference beam may be reflected by the linear filter and directed onto the second detector.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which.

DETAILED DESCRIPTION OF EMBODIMENTS

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known devices and methods are omitted so as not to obscure the description of the present invention with unnecessary details.

The linear filter wavelength locker of the present invention provides spectral coverage over a desired wavelength region with a high level of wavelength discrimination. The linear filter wavelength locker of the present invention also allows focusing elements to be incorporated readily into the system, improving the collection efficiency of the detectors and reducing the number of wavelength dependent components required. The outputs of the detectors are provided to a control system to control the operation of the radiation source being monitored.

Figure 1:
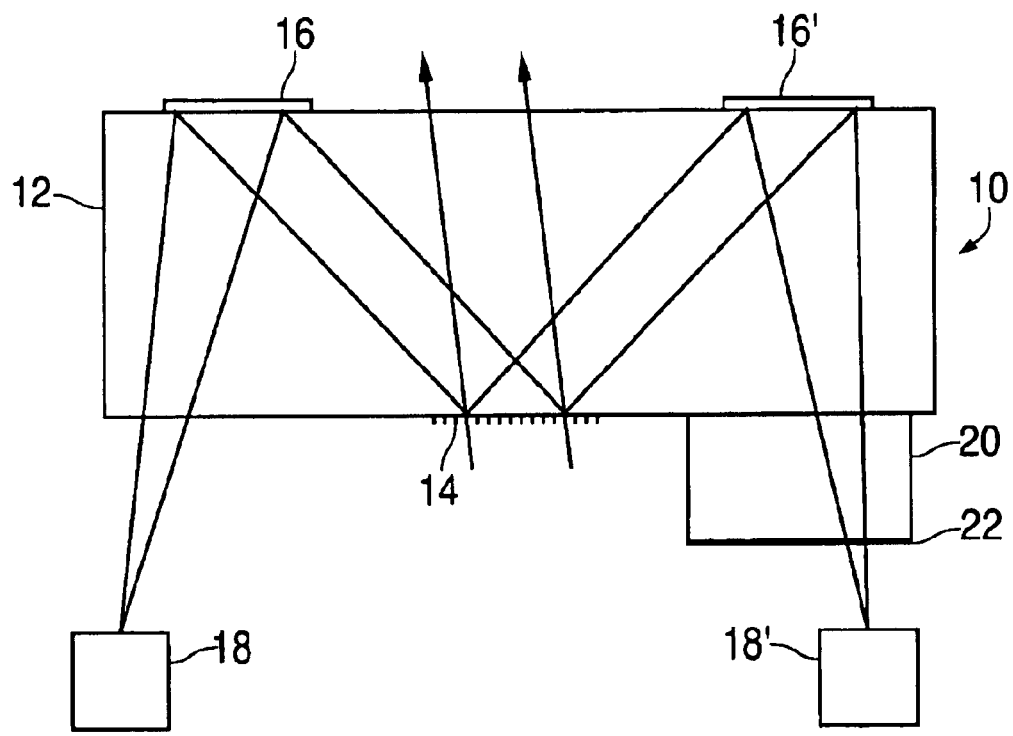
FIG. 1 is a schematic cross-sectional view of an embodiment of the wavelength locker of the present invention.

FIG. 1 illustrates a cross-sectional view of a wavelength locker 10 of the present invention. The wavelength locker 10 includes a transparent substrate 12, a splitter 14, focusing reflective portions 16, 16', detectors 18, 18' and a filter substrate 20 bonded to the transparent substrate 12. A linear filter 22 is on the filter substrate 20.

The splitter 14 receives a light beam and outputs three light beams, the application beam proceeding through the wavelength locker 10 for further use, a reference beam and a filter beam. The reference beam and the filter beam are directed to the focusing reflective portions 16, 16', respectively. The focusing reflective portions 16, 16' direct and focus the light beams onto the reference detector 18 and the filter detector 18', respectively. The linear filter 22 is in the path of the filter beam.

Figure 2:
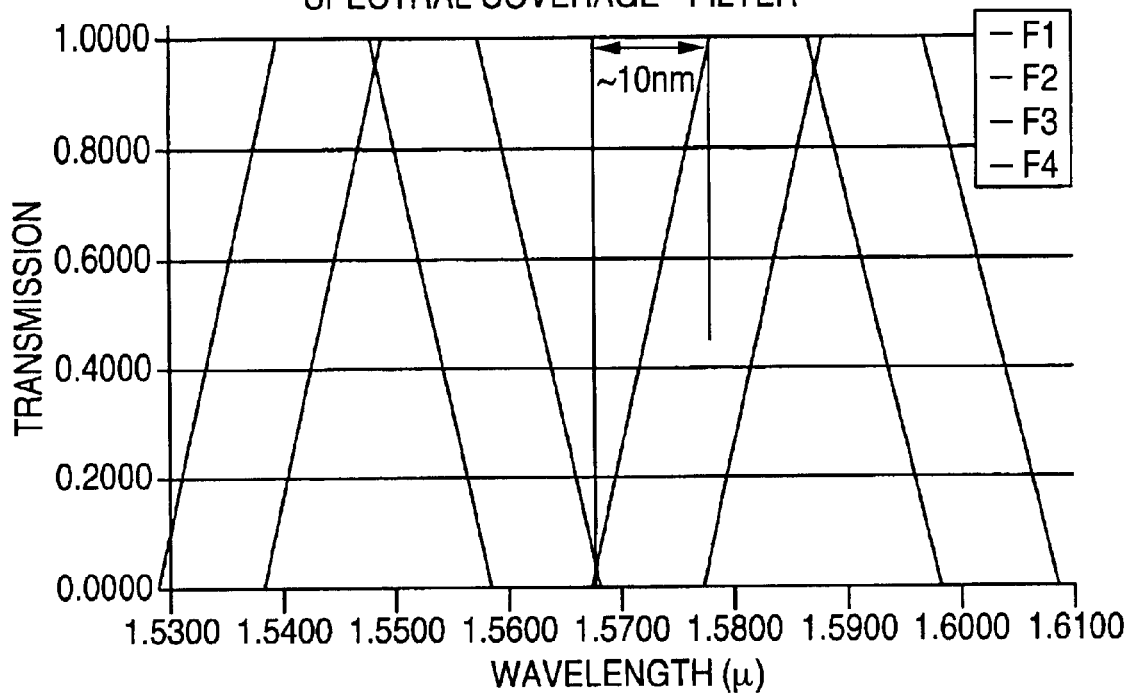
FIG. 2 is a plot of the transmission of four linear filters versus wavelength of the configuration shown in FIG. 1.

The spectral coverage provided by the wavelength locker 10 will depend on the type of linear filter(s) being employed and the spectrum to be covered. An example of spectral coverage using four linear filters is shown in FIG. 2, which is a plot of the transmission of each linear filter versus wavelength. As can be seen therein, throughout the wavelength range of interest, at least one of the linear filters has a steep slope. The minimum slope required in the region of interest will depend upon the degree of wavelength control desired. For example, by providing four wavelength lockers, each with one of the four filters shown in FIG. 2, the C and L bands can be covered. The number of channels covered by each filter will depend on the channel spacing.

Figure 3:
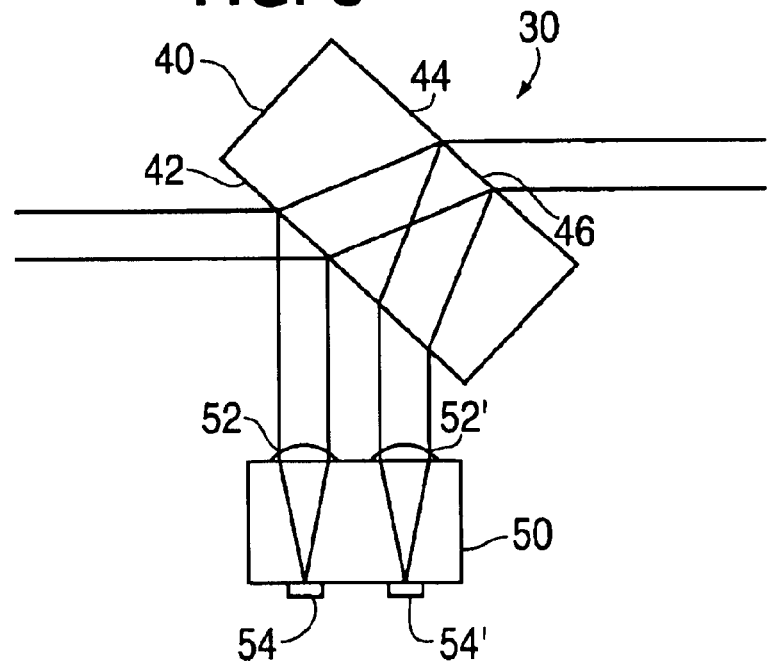
FIG. 3 is a schematic cross-sectional view of another embodiment of the wavelength locker of the present invention.

Another configuration of a wavelength locker 30 is shown in FIG. 3. Here, a transparent substrate 40 having a front surface 42 and a back surface 44 is placed in a path of a light beam to be monitored. The transparent substrate 40 is placed in the path such that part of the light beam is reflected from the front surface 42, due to the angle of incidence. In the configuration shown herein, the light reflected off the front surface 42 serves as the reference beam and is directed to a detector substrate 50. The remainder of the beam travels through the transparent substrate 40. A linear filter 46 is on the back surface 44. A portion of the light is reflected from the linear filter 46 to form a filter beam. The filter beam is reflected back towards the front surface 42, where it emerges from the transparent substrate 40 and is directed to the detector substrate 50. Since the linear filter 46 is in the path of the application beam, it will have a low maximum reflectance, e.g., 4%, or a high minimum transmittance, e.g., 96%, so that most of the beam will continue on. Alternatively, the linear filter 46 could be placed on the front surface 42, but it would have to be patterned to avoid the initial input beam. The linear filter 46 could also serve as an anti-reflective coating for the system, with a notch of response variation in the region of interest.

The detector substrate 50 includes focusing elements 52, 52', here shown as refractive elements, and detectors 54, 54'. The focusing element 52 focuses the reference beam onto the reference detector 54. The focusing element 52' focuses the filter beam onto the filter detector 54'. Alternatively, if focusing is only required in the filter beam, a focusing element may be placed in the path of the filter beam on the front surface 42 of the substrate 40.

Figure 4:
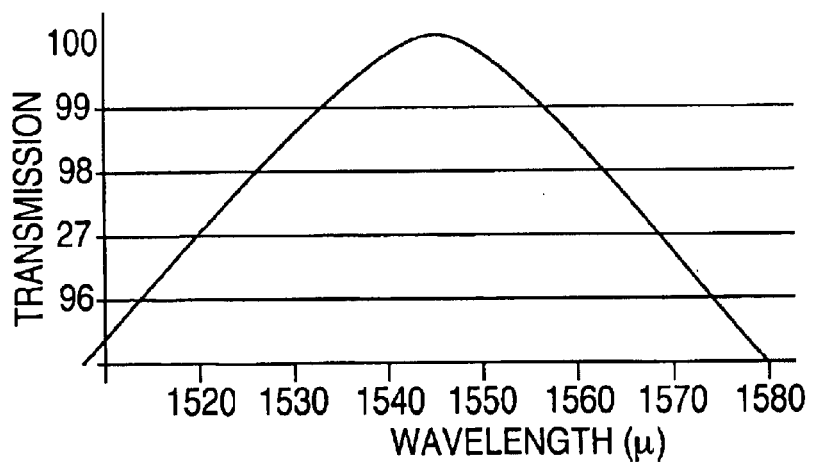
FIG. 4 is a plot of the reflectance of the linear filter versus wavelength of the configuration shown in FIG. 3.

In the embodiment shown in FIG. 3, the linear filter 46 is highly transmissive (or anti-reflective) for all wavelengths, with the slope of the response curve around the wavelength of interest is very steep, thus forming a notch filter in the region of interest. An example of the output of such the notch portion of a linear filter is shown in FIG. 4, which plots transmission versus wavelength. This linear filter having a small response variation should be easier to manufacture than that of FIG. 2, where the transmission ranges from about 10% to about 90%. It may also be possible to have a single filter providing wavelength discrimination over a larger region of interest, as shown in FIG. 4.

Figure 5:
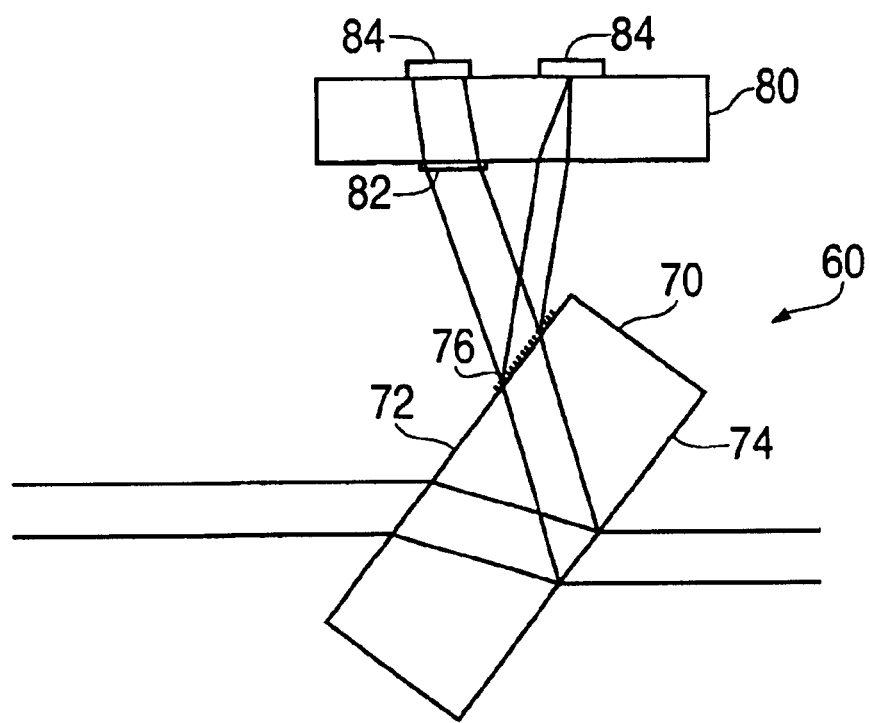
FIG. 5 is a cross-sectional view of another embodiment of the wavelength locker of the present invention.

Another configuration of a wavelength locker 60 is shown in FIG. 5. Here, a transparent substrate 70 having a front surface 72 and a back surface 74 is placed in a path of a light beam to be monitored. The transparent substrate 70 is placed in the path such that part of the light beam is reflected from the back surface 74, due to the angle of incidence. The reflected beam from the back surface is then incident on a diffractive splitter 76. The diffractive splitter 76 creates a reference beam and a filter beam. The diffractive splitter 76 may also provide focusing to either of the reference beam and the filter beam. The remainder of the beam travels through the transparent substrate 70.

The beam output from the diffractive splitter 76 is directed to a detector substrate 80. The detector substrate 80 includes a linear filter 82 thereon in the path of the filter beam. The linear filter 82 may be of the type shown in FIG. 2. In this embodiment, the filter beam is the zero order beam, so no optical functioning has been performed thereon. The filter beam proceeds to a filter detector 84' and the reference beam proceeds to the reference detector 84. Alternatively, the filter beam could be another order, e.g., first, so that the diffractive splitter 76 also provides focusing thereto. Thus, as in FIG. 1, a single element can be used to focus both the filter and the reference beams.

Figure 6:
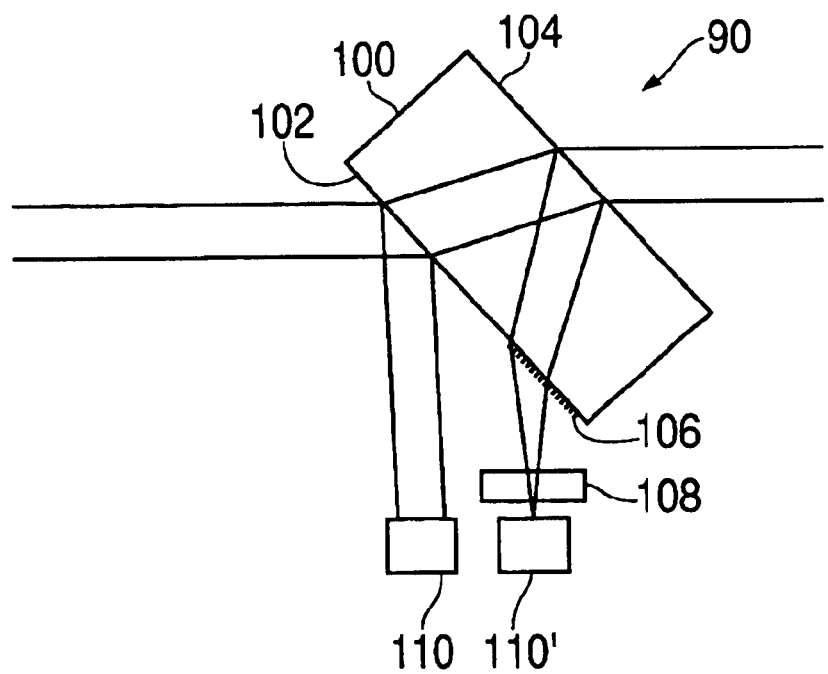
FIG. 6 is a cross-sectional view of yet another embodiment of the wavelength locker of the present invention.

Another configuration of a wavelength locker 90 is shown in FIG. 6. Here, a transparent substrate 100 having a front surface 102 and a back surface 104 is placed in a path of a light beam to be monitored. The transparent substrate 100 is placed in the path such that part of the light beam is reflected from the front surface 102, due to the angle of incidence. In the configuration shown herein, the light reflected off the front surface 102 serves as the reference beam and is directed onto a detector 110. The remainder of the beam travels through the transparent substrate 100. At the back surface 104, some of the light is again reflected to form a filter beam, with most of the light being transmitted through the substrate 100. The light reflected from the back surface 104 is directed onto a focusing element 106, here shown as a diffractive element.

A wavelength dependent linear filter 108 is provided in the path of the filter beam. As shown, the linear filter 108 will have a response similar to that shown in FIG. 2. Alternatively, the linear filter 108 may be placed on the back surface 104 in the path of the application beam, so that it would have a response similar to that shown in FIG. 4.

Figure 7:
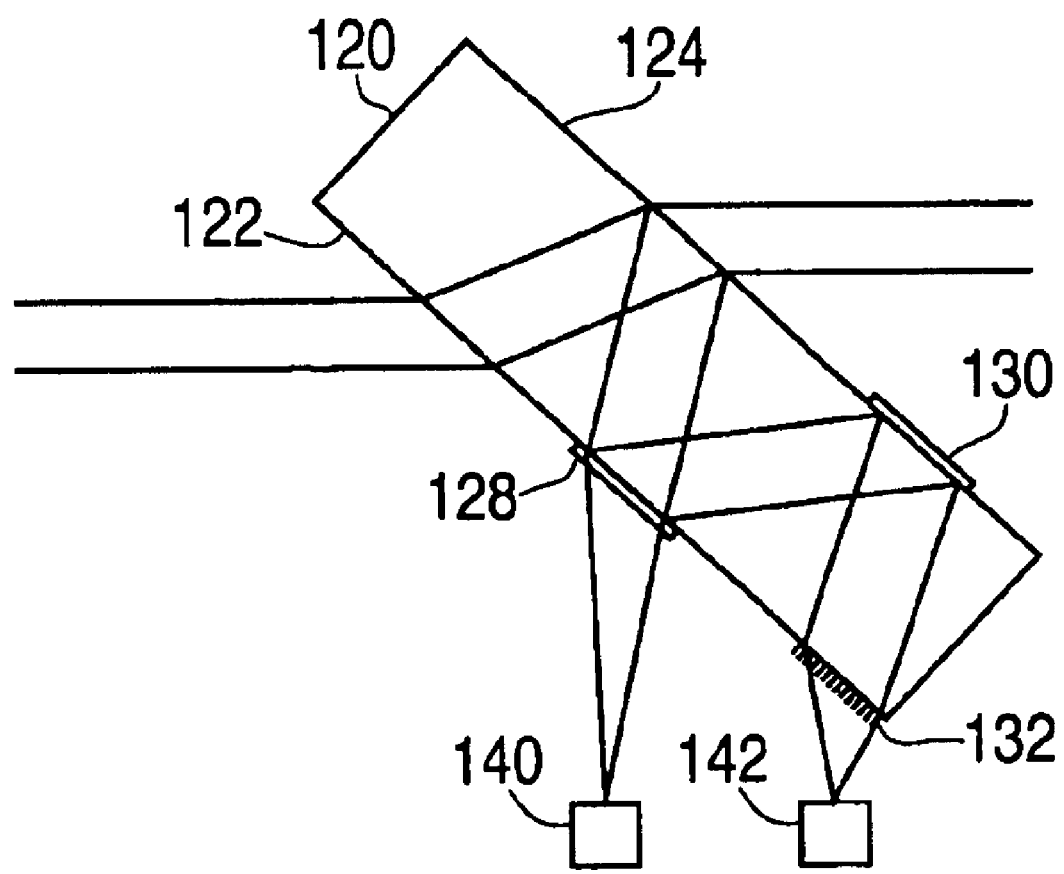
FIG. 7 is a cross-sectional view of still another embodiment of the wavelength locker of the present invention.

An embodiment of a wavelength locker in which both the transmissive and reflective properties of the linear filter are monitored is shown in FIG. 7. The configuration includes a substrate 120 having a front surface 122 and a rear surface 124. A portion of the input beam is split off at the rear surface 124 towards a linear filter 128. The linear filter 128 transmits some light to a detector 140. Some light is reflected by the linear filter, and then reflected by a reflective surface 130 toward a focusing element 132 onto a detector 142. Thus, both the reflective and transmissive components of the linear filter 128 may be monitored and control the output of the radiation source being monitored. A focusing element may be placed in the path of the transmitted beam if desired.

In all of the above configurations, anti-reflective coatings could be provided appropriately on the transparent substrate. In particular, such a coating would be useful on the front surface, increasing the amount of power in the system.

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation.

What is claimed is:

1. A wavelength detector comprising:
   a beam splitter block having first and second surfaces, the beam splitter block receiving an input beam, tapping off first and second beams that are spatially separated from one another, the first and second beams being output from the first surface, and outputting a third beam from the second surface to proceed to an application;
   an optical element on the beam splitter block providing a further optical function to at least one of the first and second beams, each of the first and second surfaces of the beam splitter block providing at least one of the tapping and the further optical function to at least one of the first and second beams;
   a linear filter in an optical path of one of the first and second beams to form a filter beam, the one of the first and second beams not filtered by the linear filter serving as a reference beam, the linear filter having a wavelength dependent response;
   a first detector receiving the filter beam; and
   a second detector receiving the reference beam.

2. The wavelength detector of claim 1, wherein the optical element on the beam splitter block is a focusing element.

3. The wavelength detector of claim 1, wherein the optical element on the beam splitter block is the linear filter.

4. The wavelength detector of claim 3, wherein the linear filter is on the second surface and the third beam passes through the linear filter.

5. The wavelength detector of claim 1, further comprising a focusing element that focuses both the filter beam and the reference beam.

6. The wavelength detector of claim 1, further comprising a focusing element focusing the reference beam on the second detector.

7. The wavelength detector of claim 1, wherein the linear filter is a notch filter.

8. The wavelength detector of claim 1, wherein the beam splitter block splits off the first beam at the first surface and the second beam at the second surface.

9. The wavelength detector of claim 1, wherein the first and second detectors are in the same plane.

10. The wavelength detector of claim 1, further comprising a mount supporting the first and second detectors.

11. The wavelength detector of claim 1, wherein the first and second beam are tapped off the input beam at the second surface and are separated by a diffractive splitter at the first surface.

12. The wavelength detector of claim 1, further comprising a focusing element in an optical path of the filter beam.

13. The wavelength detector of claim 1, wherein the reference beam is reflected by the linear filter and directed onto the second detector.

14. The wavelength detector of claim 1, wherein the linear filter is in an optical path of the third beam.

15. The wavelength detector of claim 14, wherein the linear filter is on the splitter block.

16. The wavelength detector of claim 14, wherein the linear filter is a notch anti-reflective filter.

17. The wavelength detector of claim 1, wherein the optical element on the splitter block is an anti-reflective coating.

18. The wavelength detector of claim 1, wherein the linear filter is on the splitter block.

19. The wavelength detector of claim 1, wherein the linear filter is a notch anti-reflective filter.

20. The wavelength detector of claim 1, wherein the filter beam passes through the linear filter.

* * * * *